United States Patent
Bergman et al.

(10) Patent No.: US 11,973,034 B2
(45) Date of Patent: Apr. 30, 2024

(54) NANOTWIN COPPER MATERIALS IN SEMICONDUCTOR DEVICES

(71) Applicant: Applied Materials, Inc., Santa Clara, CA (US)

(72) Inventors: Eric J. Bergman, Kalispell, MT (US); John L. Klocke, Kalispell, MT (US); Marvin L. Bernt, Kalispell, MT (US); Jing Xu, Kalispell, MT (US); Kwan Wook Roh, Kalispell, MT (US)

(73) Assignee: Applied Materials, Inc., Santa Clara, CA (US)

(*) Notice: Subject to any disclaimer, the term of this patent is extended or adjusted under 35 U.S.C. 154(b) by 259 days.

(21) Appl. No.: 17/411,321

(22) Filed: Aug. 25, 2021

(65) Prior Publication Data
US 2023/0065426 A1 Mar. 2, 2023

(51) Int. Cl.
*H01L 23/532* (2006.01)
*C25D 3/38* (2006.01)
(Continued)

(52) U.S. Cl.
CPC .......... *H01L 23/53238* (2013.01); *C25D 3/38* (2013.01); *C25D 5/48* (2013.01); *C25D 7/12* (2013.01); *H01L 21/2885* (2013.01); *H01L 21/7684* (2013.01); *H01L 21/76877* (2013.01); *H01L 23/53252* (2013.01)

(58) Field of Classification Search
CPC .......... H01L 23/53238; H01L 21/2885; H01L 21/7684; H01L 21/76877; H01L 23/53252; C25D 3/38; C25D 5/48; C25D 7/12
See application file for complete search history.

(56) References Cited

U.S. PATENT DOCUMENTS 5,440,805 A * 8/1995 Daigle ................ H01L 21/4857
174/262
2016/0024678 A1 1/2016 Chen et al.
(Continued)

FOREIGN PATENT DOCUMENTS

| CN | 106298634 A | 1/2017 |
| CN | 110707069 A | 1/2020 |
| CN | 111463185 A | 7/2020 |

OTHER PUBLICATIONS

International Search Report and Written Opinion dated Dec. 5, 2022 in International Patent Application No. PCT/US2022/040488, 10 pages.

*Primary Examiner* — Thao X Le
*Assistant Examiner* — Sean Ayers Winters
(74) *Attorney, Agent, or Firm* — Kilpatrick Townsend & Stockton LLP

(57) ABSTRACT

Exemplary methods of electroplating a metal with a nanotwin crystal structure are described. The methods may include plating a metal material into at least one opening on a patterned substrate, where at least a portion of the metal material is characterized by a nanotwin crystal structure. The methods may further include polishing an exposed surface of the metal material in the opening to reduce an average surface roughness of the exposed surface to less than or about 1 nm. The polished exposed surface may include at least a portion of the metal material characterized by the nanotwin crystal structure. In additional examples, the nanotwin-phased metal may be nanotwin-phased copper.

19 Claims, 4 Drawing Sheets

(51) Int. Cl.
*C25D 5/48* (2006.01)
*C25D 7/12* (2006.01)
*H01L 21/288* (2006.01)
*H01L 21/768* (2006.01)

(56) References Cited

U.S. PATENT DOCUMENTS

| | | |
|---|---|---|
| 2016/0355940 A1 | 12/2016 | Chen et al. |
| 2021/0193514 A1* | 6/2021 | Oberst ............... H01L 24/03 |
| 2022/0018036 A1* | 1/2022 | Banik, II ............. C25D 5/605 |
| 2023/0212773 A1* | 7/2023 | Oberst ............... C25D 5/10 |
| | | 205/123 |

* cited by examiner

NANOTWIN COPPER MATERIALS IN SEMICONDUCTOR DEVICES

TECHNICAL FIELD

The present technology relates to electrochemical deposition operations in semiconductor processing. More specifically, the present technology relates to systems and methods that perform electrochemical depositions of nanotwin-copper-containing materials on semiconductor structures and in semiconductor packaging.

BACKGROUND

Integrated circuits are made possible by processes that produce intricately patterned material layers on substrate surfaces. After formation, etching, and other processing on a substrate, metal or other conductive materials are often deposited or formed to provide the electrical connections between components. Because this metallization may be performed after many manufacturing operations, problems caused during the metallization may create expensive waste substrates or wafers.

Electroplating is performed in an electroplating chamber with the target side of the wafer in a bath of liquid electrolyte, and with electrical contacts on a contact ring touching a conductive layer, such as a seed layer, on a substrate material. Electrical current is passed through the electrolyte and the conductive layer from a power supply. Metal ions in the electrolyte plate out onto the substrate material, creating a metal layer on the substrate material. When the substrate material has patterned, non-planar features defined across the surface, the metal ions in the electrolyte may not deposit at the same rate at all points on the non-planar features. These variations can challenge electroplating operations and create deposited materials that include voids and non-uniform thicknesses, among other defects.

Thus, there is a need for improved systems and methods that can be used to produce high-quality devices and structures. These and other needs are addressed by the present technology.

SUMMARY

Embodiments of the present technology include electroplating methods that include plating a metal material into at least one opening on a patterned substrate. At least a portion of the metal material is characterized by a nanotwin crystal structure. The methods may also include polishing an exposed surface of the metal material in the opening to reduce an average surface roughness of the exposed surface to less than or about 1 nm. The polished surface includes as least a portion of the metal material characterized by the nanotwin crystal structure.

In additional embodiments, the metal material characterized by the nanotwin crystal structure is nanotwin copper. In further embodiments, the metal material may include at least a second metal layer that is selected from gallium, silver, gold, and platinum. In still further embodiments, the metal material is polished with chemical mechanical polishing. In yet additional embodiments, the metal material is polished with electropolishing. In more embodiments, the polishing of the exposed surface of the metal material is performed in an oxygen-free environment, and where the polishing removes one or more metal oxides from the exposed surface of the metal material. In still more embodiments, the metal material includes a first portion in contact with a bottom surface of the opening that is free of the nanotwin crystal structure and a second portion in contact with the polished exposed surface that includes the nanotwin crystal structure. In still additional embodiments, the patterned substrate further includes a barrier layer positioned between the first portion and the second portion of the metal material in the opening.

Embodiments of the present technology also include electroplating methods that include plating a first portion of a metal material on a bottom portion of at least one opening on a patterned substrate, where the first portion of the metal material is substantially free of nanotwin crystal structures. The methods further include forming a barrier layer on the first portion of the metal material. The methods additionally include plating a second portion of the metal material on the barrier layer, where the second portion of the metal material is characterized by a nanotwin crystal structure.

In additional embodiments, the first portion of the metal material is greater than or about 50 wt. % of a total amount of the metal material in the opening. In further embodiments, the metal material is copper. In still further embodiments, the second portion of the metal material incudes at least a second metal selected from gallium, silver, gold, and platinum. In yet additional embodiments, the barrier layer includes a metal that is not included in the second portion of the metal material. In more embodiments, the method further includes polishing an exposed surface of the second portion of the metal material in the opening to reduce an average surface roughness of the exposed surface to less than or about 1 nm.

Embodiments of the present technology further include circuit device structures that include a patterned substrate. The patterned substrate includes at least one opening having a top portion and a bottom surface. At least the top portion of the opening is filled with a metal-containing material, where the metal-containing material includes an exposed surface characterized by an average surface roughness that is less than or about 1 nm, and where the metal-containing material is characterized by a nanotwin crystal structure.

In additional embodiments, the patterned substrate further includes a barrier layer positioned between the metal-containing material filling the top portion of the opening and a second portion of the metal-containing material in contact with the bottom surface of the opening. In further embodiments, the second portion of the metal-containing material is free of the nanotwin crystal structure. In still further embodiments, the metal-containing material includes copper. In yet additional embodiments, the metal-containing material in the top portion of the opening includes at least a second metal selected from gallium, silver, gold, and platinum. In more embodiments, the opening in the patterned substrate is characterized by an aspect ratio that is greater than or about 1:1.

Embodiments of the present technology permit the formation and finishing of nanotwin metals, such a nanotwin copper, in openings on patterned substrates. These embodiments form metal lines, vias, pillars, and other metal-containing components of an integrated circuit device, where bonding surfaces on the components include metal with a nanotwin crystal structure. In many instances, metals with a nanotwin crystal structure are less susceptible to oxide formation and more easily bond to similar metal surfaces at lower bonding temperatures and pressures. Additionally, embodiments of the present technology may be performed in a plating chamber in which nanotwin-metal-containing lines and columns are formed at high throughput into openings on a patterned substrate. These and other embodiments, along with many of their advantages and features, are described in more detail in conjunction with the below description and attached figures.

BRIEF DESCRIPTION OF THE DRAWINGS

A further understanding of the nature and advantages of the disclosed embodiments may be realized by reference to the remaining portions of the specification and the drawings.

Figure 1:
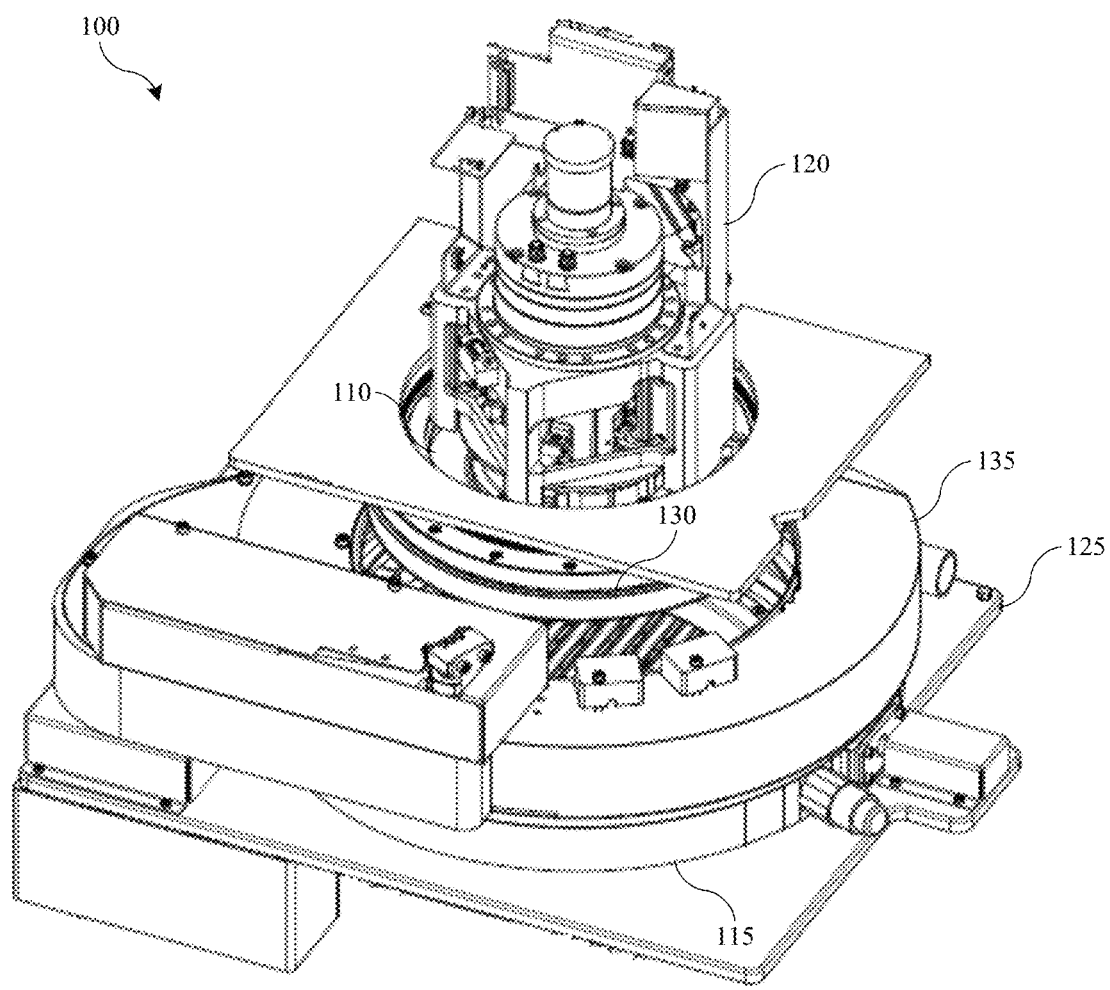
FIG. 1 shows a schematic perspective view of an electroplating system according to some embodiments of the present technology.

Several of the figures are included as schematics. It is to be understood that the figures are for illustrative purposes and are not to be considered of scale unless specifically stated to be of scale. Additionally, as schematics, the figures are provided to aid comprehension and may not include all aspects or information compared to realistic representations and may include exaggerated material for illustrative purposes.

In the figures, similar components and/or features may have the same numerical reference label. Further, various components of the same type may be distinguished by following the reference label by a letter that distinguishes among the similar components and/or features. If only the first numerical reference label is used in the specification, the description is applicable to any one of the similar components and/or features having the same first numerical reference label irrespective of the letter suffix.

DETAILED DESCRIPTION

Many types of electronic devices that use semiconductor-based integrated circuits have progressed from single chip (i.e., die) packages, which are electronically interconnected through a circuit board, to multiple chips that are stacked or otherwise arrayed in a single package. These multiple-die packages can include dies for memory, logic, micro-electro-mechanical-systems (MEMS), and sensors, among other functions, and may include system-on-chip (SoC) and system-in-package (SiP) packages. As these multiple-chip packages add more chips that are further miniaturizing, the density of the electrical interconnections (i.e., the interconnect density) between them increases. This has caused the size of those interconnections to decrease. These sizes, commonly measured as the pitch of an electrically-conductive line or via that makes an interconnection between input/output pads on adjacent semiconductor dies, have decreased from several hundred micrometers to 10 µm or less.

The decrease in the pitch size of the interconnects has changed how the connections are formed. For many kinds of increasingly miniaturized multi-die packages, a conventional solder bump, measuring hundreds of microns in diameter, is too large to form high-density interconnects with pitch sizes of 50 µm or less. In many instances, these high-density interconnects eliminate solder bumps and form a direct metal-to-metal connection between opposite facing lines, vias, and pads of the interconnect.

In most conventional, high-interconnect-density integrated circuit devices, the direct metal-to-metal connections are made with polycrystalline copper whose grains are in random orientations. Unfortunately, as the pitch sizes of copper lines, vias, and pillars continue to decrease, the limitations of polycrystalline copper become more apparent. In many cases, the oxidation and diffusivity characteristics, among other characteristics, of polycrystalline copper require copper-copper bonding to be done at high temperatures and pressures. The bonding conditions can cause more cracks and other defects in the smaller and thinner copper lines around the bonding site. The number of defects is further compounded by the increased density of bonding sites in the high-interconnect-density integrated circuits. As interconnect pitch sizes and other dimensions continue to decrease and bonding site density continues to increase, the problems with high-temperature, high-pressure bonding of polycrystalline copper surfaces continue to grow.

Embodiments of the present technology address the problems with bonding polycrystalline copper in high-interconnect-density integrated circuit devices by replacing the polycrystalline copper with nanotwin copper (NTCu), which has a <1,1,1> crystallographic orientation. In additional embodiments, a significant percentage of the NTCu grains at a bonding surface of the metal are oriented in the same <1,1,1> direction. NTCu is significantly less prone to oxidation and the formation of copper oxide than polycrystalline copper. NTCu is also characterized by diffusivity rates that are normally $\times 10^3$ to $\times 10^4$ higher than polycrystalline copper. Due to these and other characteristics, bonding temperatures and pressures for NTCu are significantly lower than polycrystalline copper. Unfortunately, NTCu is not as stable as other crystal phases of copper, and it has proven challenging to form metal contact surfaces with a significant fraction of the surface made of NTCu. Contact surfaces formed from electroplated NTCu can also be characterized by a high average surface roughness. The rough contact surfaces can reduce the contact area between opposite facing ends of an interconnect and require higher bonding temperatures and pressures to form a sufficient bond between the ends.

Embodiments of the present technology address the problems of poor NTCu coverage and high levels of roughness in the contact surfaces of electroplated NTCu formed in narrow-pitch, high-aspect-ratio openings on patterned substrates. Embodiments of the present technology include methods of filling and finishing copper-containing materials in narrow-pitch, high-aspect-ratio openings to provide contact surfaces in those materials that have high levels of NTCu and low average surface roughness. The embodiments include methods of electroplating NTCu copper up from a bottom surface of the opening so that the top of the opening where the contact surface is formed includes a large percentage of NTCu. The embodiments further include polishing the exposed contact surfaces to reduce their average surface roughness and remove contaminants such as metal oxides. The embodiments also include forming a barrier layer between bottom and top portions of the metal-containing material filling the opening. The barrier layer can prevent non-nanotwin-phased metal in the bottom portion from diluting and converting nanotwin-phased metal to other crystal phases the top portion of the opening. The embodiments still also include forming a second metal layer on the contact surface of the electroplated NTCu copper. The second metal layer is selected to enhance the low-temperature, low-pressure bonding of opposite facing ends of a metal interconnect. These and other embodiments of the present technology are discussed further below.

FIG. 1 shows a schematic perspective view of an electroplating system 100 that can perform NTCu electroplating methods according to embodiments of the present technology. Electroplating system 100 illustrates an exemplary electroplating system, including a system head 110 and a bowl 115. During electroplating operations, a wafer may be clamped to the system head 110, inverted, and extended into bowl 115 to perform an electroplating operation. Electroplating system 100 may include a head lifter 120, which may be configured to both raise and rotate the head 115, or otherwise position the head within the system, including tilting operations. The head and bowl may be attached to a deck plate 125 or other structure that may be part of a larger system incorporating multiple electroplating systems 100, and which may share electrolyte and other materials. A rotor may allow a substrate clamped to the head to be rotated within the bowl or outside the bowl in different operations. The rotor may include a contact ring, which may provide the conductive contact with the substrate. A seal 130 discussed further below may be connected with the head. Seal 130 may include a chucked wafer to be processed. FIG. 1 illustrates an electroplating system 100 that may include components to be cleaned directly on the platform. In embodiments, the electroplating system 100 further includes an in situ rinse system 135 for component cleaning. In additional embodiments (not shown) an electroplating system may be configured with a platform on which the head may be moved to an additional module where a seal or other component cleaning is performed.

Figure 2:
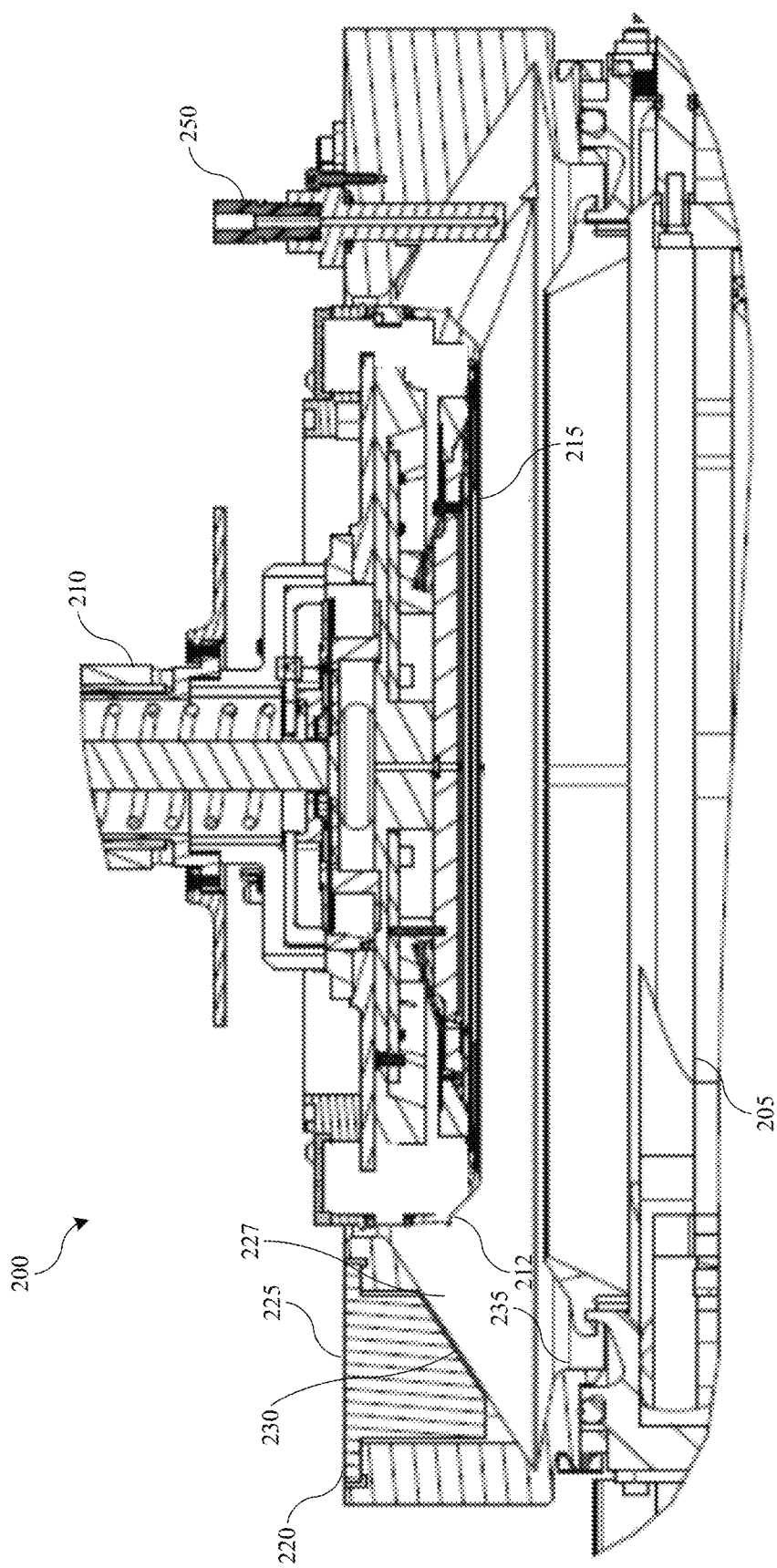
FIG. 2 shows a partial cross-sectional view of an electroplating system according to some embodiments of the present technology.

FIG. 2 shows a partial cross-sectional view of an electroplating chamber that includes an electroplating apparatus 200 according to some embodiments of the present technology. The electroplating apparatus 200 may be incorporated with an electroplating system, including system 100 described above. As illustrated in FIG. 2, a plating bath 205 of an electroplating system is shown along with a head 210 having a substrate 215 coupled with the head. In the embodiment shown, a substrate is coupled with a seal 212 incorporated on the head 210. A rinsing frame 220 may be coupled above the plating bath vessel 205 and may be configured to receive the head 210 into the vessel during plating. Rinsing frame 220 may include a rim 225 extending circumferentially about an upper surface of the plating bath vessel 205. A rinsing channel 227 may be defined between the rim 225 and an upper surface of the plating bath vessel 205. For example, rim 225 may include interior sidewalls 230 characterized by a sloping profile. As described above, rinse fluid slung off a substrate may contact the sidewalls 230 and may be received in a plenum 235 extending about the rim for collection of the rinse fluid from the electroplating apparatus 200.

In embodiments, electroplating apparatus 200 may additionally include one or more cleaning components. The cleaning components may include one or more nozzles used to deliver fluids to or towards the substrate 215 or the head 210. FIG. 2 illustrates one of a variety of embodiments in which improved rinse assemblies may be used to protect the bath and substrate during rinsing operations. In additional embodiments, a side clean nozzle 250 may extend through the rim 225 of the rinsing frame 220 and be directed to rinse seal 212, along with aspects of substrate 215.

Figure 3:
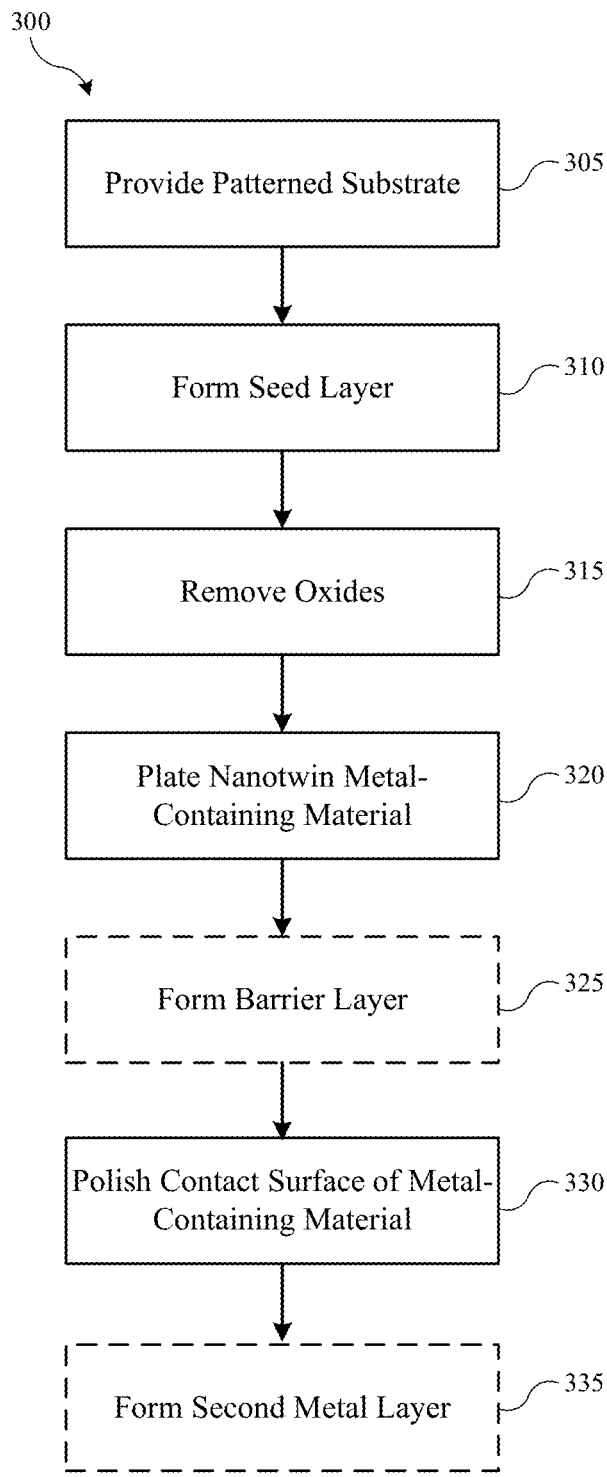
FIG. 3 shows exemplary operations in a method of electroplating according to some embodiments of the present technology.

Embodiments of the above-described systems and chambers may be used to perform embodiments of the present NTCu electroplating methods. FIG. 3 shows exemplary operations in a method 300 of electroplating and finishing a NTCu-containing material according to embodiments of the present technology. The method 300 may also include one or more operations prior to the initiation of the method, including front-end processing, deposition, gate formation, etching, polishing, cleaning, or any other operations that may be performed prior to the described operations. The method may further include a number of optional operations, which may or may not be specifically associated with some embodiments of methods according to the present technology. For example, many of the operations are described in order to provide a broader scope of the processes performed but are not critical to the technology or may be performed by alternative methodology, as will be discussed further below. Method 300 may describe operations shown schematically in FIGS. 4A-4C, the illustrations of which will be described in conjunction with the operations of method 300. It is to be understood that the figures illustrate only partial schematic views, and a substrate may contain any number of additional materials and features having a variety of characteristics and aspects, as illustrated in the figures. Embodiments of method 300 may or may not involve optional operations to develop the semiconductor structure to a particular fabrication operation.

Figure 4A:
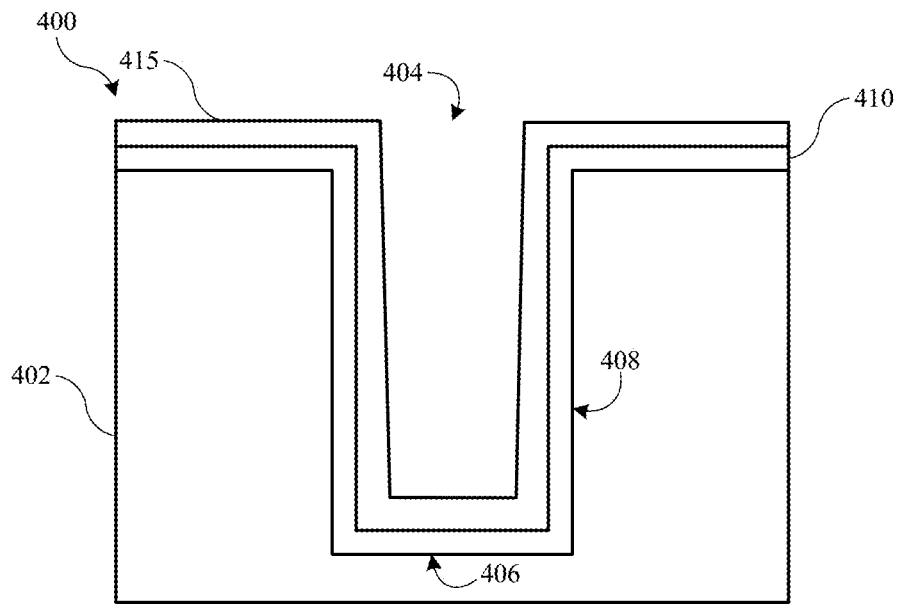
FIGS. 4A-4B show schematic cross-sectional views of a patterned substrate undergoing a plating of nanotwin-copper-containing material according to some embodiments of the present technology.
Figure 4B:
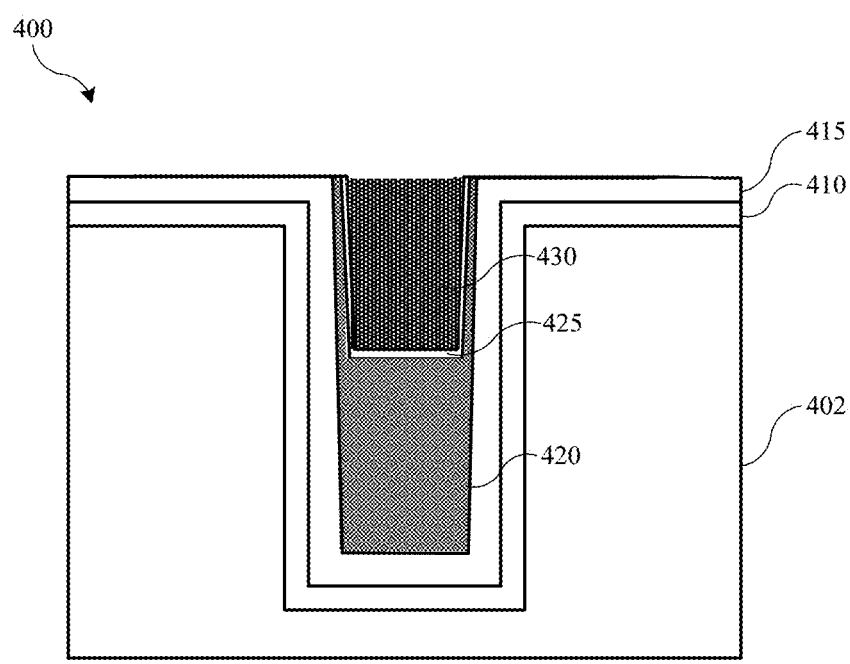

Embodiments of method 300 include providing a patterned substrate 400 in operation 305. FIG. 4A shows a portion of a patterned substrate 400 that may be included in, for example, an intermediate packaging region of a single-die or multi-die (e.g., 3D-IC) integrated circuit package. The portion of patterned substrate 400 may include at least one opening 404. In embodiments, the opening 404 may include a bottom surface 406 and one or more sidewall surfaces 408. In further embodiments, the opening 404 may be a trench that shapes part of an NTCu-containing conductive line, such as a redistribution line in an intermediate packaging region. In additional embodiments, the opening 404 may be a via that shapes an NTCu-containing conductive via or pillar. In still further embodiments, the opening 404 may include one or more of a recess, a step, or an isolation structure, among other kinds of structures.

In embodiments, the patterned substrate 400 may include a dielectric layer 402 into which the opening 404 may be formed. In the embodiment shown in FIG. 4A, the opening 404 terminates in the dielectric layer 402 to leave the bottom surface 406 of the opening made of an exposed surface of the dielectric layer 402. These openings may include trenches that shape part of an NTCu-containing, electrically conductive line, such as a redistribution line. In additional embodiments (not shown), one or more openings may extend through the dielectric layer and terminate at an underlying conductive layer, such as a pad layer. In these embodiments, the underlying layer forms the bottom surface of the opening instead of the dielectric layer. These openings may include columnar vias and pillars that electrically connect metal lines and layers in vertically separated planes.

In embodiments, the opening 404 may be characterized by a pitch that is less than or about 100 µm, less than or about 75 µm, less than or about 50 µm, less than or about 40 µm, less than or about 30 µm, less than or about 20 µm, less than or about 10 µm, less than or about 5 µm, less than or about 4 µm, less than or about 3 µm, less than or about 2 µm, less than or about 1 µm, or less. In further embodiments, the opening 404 may be characterized by a height-to-width ratio (i.e., an aspect ratio) that is greater than or about 0.25:1, greater than or about 0.5:1, greater than or about 0.75:1, greater than or about 1:1, greater than or about 2:1, greater than or about 3:1, greater than or about 4:1, greater than or about 5:1, greater than or about 6:1, greater than or about 7:1, greater than or about 8:1, greater than or about 9:1, greater than or about 10:1, or more.

In additional embodiments, the patterned substrate 400 may be formed by depositing and patterning a photoresist material on at least one layer of dielectric material and etching the at least one opening into the layer of dielectric material through the patterned photoresist. In further embodiments, the patterned substrate 400 may be formed in at least one layer of semiconductor material. In more embodiments, the at least one layer of dielectric material may include silicon oxide, silicon nitride, silicon-carbon-nitride, or an organic polymer (e.g., a benzocycloalkane), among other dielectric materials. In still more embodiments, the at least one layer of semiconductor material may include silicon, germanium, or gallium arsenide, among other semiconductor materials.

In further embodiments, the patterned substrate 400 may include a barrier layer 410 that can limit the diffusion or interaction of fill material with the underlying substrate. In embodiments, the barrier layer 410 may include one or more of a refractory metal, a metal oxide, or a metal nitride, among other barrier layer materials. In additional embodiments, the barrier layer 410 may include one or more of tantalum, titanium, or tantalum nitride. In yet additional embodiments, the barrier layer 410 may facilitate deposition of a seed layer 415 and may also be or include an adhesion layer to facilitate the formation of the seed layer.

Embodiments of method 300 also include forming a seed layer 415 at operation 310. In embodiments, the seed layer 415 may be deposited at a uniform rate on all the interior surfaces of the opening 404, including the bottom surface 406 and the sidewall surfaces 408. In still further embodiments, the seed layer 415 may be a conformal layer that has the same thickness on both the bottom surface 406 and the sidewall surfaces 408. In embodiments, the seed layer 415 may be formed by physical vapor deposition or atomic layer deposition, among other deposition techniques. In additional embodiments, the seed layer 415 may include the same materials that are plated into the opening 404. In further embodiments, the seed layer 415 may include NTCu.

In additional embodiments, the seed layer 415 may be formed to a thickness of less than or about 100 nm, less than or about 50 nm, less than or about 25 nm, less than or about 10 nm, less than or about 5 nm, or less. In further embodiments, the formation of the seed layer 415 may provide coverage along certain regions of the opening 404, such as the bottom corners or sidewall surfaces 408 proximate the bottom surface 406 of the opening. In further embodiments, the seed layer 415 is thin enough to avoid pinching-off at the top of the opening that can hinder or prevent the electrodeposition of the NTCu-containing material into the opening by slowing or barring the NTCu-containing electrochemical plating fluid from reaching the bottom of the opening 404. It is to be understood that the structural characteristics of the opening 404, including the pitch size aspect ratio of the opening among other structural characteristics, is not intended to be limiting, and any of a variety of other patterned substrates 400, including seed layer materials, are similarly encompassed. Other exemplary patterned substrates may include two-dimensional and three-dimensional patterned substrates common in semiconductor manufacturing, and within which an opening or other feature may be formed, and along which a seed layer may be deposited. Additionally, although a patterned substrate that includes high-aspect-ratio openings may benefit from the present technology, the technology may be equally applicable to lower aspect ratio openings and other structures.

Embodiments of method 300 may further include removing one or more contaminants from the as-deposited seed layer 415 at operation 315. In additional embodiments, the one or more contaminants may include metal oxides that form on surfaces of the seed layer 415 that are exposed to oxygen in the aqueous electrochemical plating fluid or directly to air. In further embodiments, these metal oxides may include copper oxides, such as copper dioxide ($CuO_2$), that may be formed, at least in part, by the oxidation of copper metal in the seed layer 415. In more embodiments, the contaminants may be removed by contacting the as-deposited seed layer 415 with an etchant bath. In embodiments, the etchant bath may include an aqueous solution of an inorganic acid such as hydrochloric acid or sulfuric acid. In additional embodiments, the etchant bath may include a corrosion inhibitor, such as benzotriazole. In further embodiments, the contaminants may be removed by a plasma, such as an oxygen-containing etch plasma to remove organic materials, an argon- and/or nitrogen-containing plasma to expose a pristine surface, or a hydrogen-containing plasma to reduce surface oxides on the metal-containing surface, among other kinds of plasmas.

Embodiments of method 300 may yet also include plating an NTCu-containing material 420 into at least one opening 404 of a patterned substrate 400 at operation 320. In some embodiments, the plating operation may further optionally include interrupting the plating operation to form a barrier layer 425 on a first portion of the plated material at operation 325. In these embodiments, the method 300 includes plating a first portion of copper-containing material 420 in a bottom portion of the opening 404, forming a barrier layer 425 on the first portion of material, and plating a second portion of copper-containing material 430 in a top portion of the opening. In additional embodiments, the barrier layer 425 prevents first portion of the copper-containing material 420 from diluting and converting the NTCu in the second portion 430 into non-nanotwin phases of copper. By incorporating the barrier layer 425 into the copper-containing fill of opening 404, the first portion of the copper-containing material 420 plated into the bottom portion of the opening may be done rapidly, and the material 420 may have more polycrystalline copper and less NTCu than the second portion of the copper-containing material 430. The barrier layer 425 also sets a new bottom surface for the opening 404 that is higher up in the opening than the original bottom surface 406. The second portion of the copper-containing material 430 is plated in a shallower opening with a lower aspect ratio than the original opening 404. This allows the plating of the second portion 430 to have a more bottom-up character with less polycrystalline copper impinging on the NTCu from the sidewall surfaces 408.

In further embodiments, the barrier layer 425 may be made of an electrically conductive material, such as a metal other than copper, that does not substantially increase the electrical resistance through the copper-containing material filling the opening 404. In yet further embodiments, the barrier layer may be made of one or more metals such as gallium, silver, gold, or platinum, among other metals. In more embodiments, the barrier layer 425 may be a thin layer deposited by physical vapor deposition or atomic layer deposition among other deposition techniques. The barrier layer 425 may have a thickness that is less than or about 25 nm, less than or about 20 nm, less than or about 15 nm, less than or about 10 nm, less than or about 5 nm, or less.

In additional embodiments, the first portion of the copper-containing material 420 may be plated at a first deposition rate that is faster than a second deposition rate for plating the second portion of the copper-containing material 430. In further embodiments, the first deposition rate for the first portion of the copper-containing material 420 may be greater than or about 10% faster than a second deposition rate for the second portion of the copper-containing material 430. In still additional embodiments, the percentage difference in the first and second deposition rates may be greater than or about 15%, greater than or about 20%, greater than or about 25%, greater than or about 30%, greater than or about 35%, greater than or about 40%, greater than or about 45%, greater than or about 50%, or more. In more embodiments, the plating rate for the first portion of copper-containing material 420 may be greater than or about 0.5 μm/minute, greater than or about 0.75 μm/minute, greater than or about 1 μm/minute, greater than or about 1.25 μm/minute, greater than or about 1.5 μm/minute, or higher. In yet more embodiments, the plating of the first portion of the copper-containing material 420 may last until the partially-filled opening reaches an aspect ratio of less than or about 2:1, less than or about 1.5:1, less than or about 1:1, less than or about 0.5:1, or less. In yet further embodiments, the plating operation during the first period of time may include delivering a continuous forward current to the patterned substrate 400 from a DC power supply. In still additional embodiments, the as-plated first portion of the copper-containing material 420 may include less than or about 25 wt. % NTCu, less than or about 20 wt. % NTCu, less than or about 15 wt. % NTCu, less than or about 10 wt. % NTCu, less than or about 5 wt. % NTCu, less than or about 1 wt. % NTCu, or less.

In further embodiments, the second portion of the copper-containing material 430 formed in the top portion of opening 404 may be plated at a second deposition rate that is less than or about 1 μm/minute, less than or about 0.9 μm/minute, less than or about 0.8 μm/minute, less than or about 0.7 μm/minute, less than or about 0.6 μm/minute, less than or about 0.5 μm/minute, or less. In yet additional embodiments, the second portion of the copper-containing material 430 may include greater than or about 50 wt. % NTCu, greater than or about 55 wt. % NTCu, greater than or about 60 wt. % NTCu, greater than or about 65 wt. % NTCu, greater than or about 70 wt. % NTCu, greater than or about 75 wt. % NTCu, greater than or about 80 wt. % NTCu, greater than or about 85 wt. % NTCu, greater than or about 90 wt. % NTCu, or more.

In additional embodiments, the plating operation 320 may include the pulsed delivery of forward and reverse currents to the patterned substrate that plate and de-plate copper from the surfaces of the substrate. In some embodiments of the plating operation 320 that further include forming the barrier layer 425 at operation 325, the pulsed delivery of forward and reverse currents may be limited to the plating of the second portion of the copper-containing material 430. In additional embodiments, where a barrier layer 425 is not formed, the pulsed delivery of forward and reverse currents may be used for all portions of plating operation 320. In the discussion of the pulsed delivery of forward and reverse currents to the patterned substrate below, the bottom surface may refer to either the bottom surface 406 of the opening 404 when no barrier layer 425 is formed, or the bottom surface formed by the barrier layer 425 when one is formed.

In embodiments, the pulsed delivery of forward and reverse currents to the patterned substrate may include a reverse current that de-plates the copper from the sidewall surfaces 408 faster than the bottom surface of the opening 404. Successive cycles of forward and reverse current plate more NTCu-containing material on the bottom surface than polycrystalline copper on the sidewall surfaces 408. When the fill has reached the top of the opening 404 a majority of the copper on the contact surface of the fill has a nanotwin crystal orientation. In further embodiments, the contact surface includes NTCu across greater than or about 50% of the surface area, greater than or about 55% of the surface area, greater than or about 60% of the surface area, greater than or about 65% of the surface area, greater than or about 70% of the surface area, greater than or about 75% of the surface area, greater than or about 80% of the surface area, greater than or about 85% of the surface area, greater than or about 90% of the surface area, or more.

In embodiments, the forward current is supplied to the patterned substrate 400 in contact with the electrochemical plating fluid in the electroplating chamber with a pulsing DC power supply. In additional embodiments, the pulse of forward current may be characterized by a duty cycle of less than or about 50%, less than or about 45%, less than or about 40%, less than or about 35%, less than or about 30%, less than or about 25%, less than or about 20%, or less. In further embodiments, the on-time of the duty cycle may be greater than or about 0.5 seconds, greater than or about 1 second, greater than or about 1.5 seconds, greater than or about 2 seconds, greater than or about 2.5 seconds, greater than or about 3 seconds, greater than or about 3.5 seconds, greater than or about 4 seconds, greater than or about 4.5 seconds, greater than or about 5 seconds, or more. In still further embodiments, the forward current may be characterized by an average current density of less than or about 2.0 mA/cm$^2$, less than or about 1.5 mA/cm$^2$, less than or about 1.0 mA/cm$^2$, less than or about 0.5 mA/cm$^2$, or less. In more embodiments, the forward current may be characterized by a peak current during the on-time of greater than or about 0.5 A, and may be greater than or about 1.0 A, greater than or about 1.5 A, greater than or about 2.0 A, greater than or about 2.5 A, greater than or about 3.0 A, greater than or about 3.5 A, greater than or about 4.0 A, greater than or about 4.5 A, greater than or about 5.0 A, or higher. In still more embodiments, the peak current may be characterized by a peak current density of greater than or about 2 mA/cm$^2$, and may be greater than or about 5 mA/cm$^2$, greater than or about 10 mA/cm$^2$, greater than or about 20 mA/cm$^2$, greater than or about 50 mA/cm$^2$, or higher.

In additional embodiments, the reverse current is delivered to the patterned substrate 400 following the delivery of the forward current. In embodiments, the reverse current may be delivered by the same pulsing DC power supply that delivers the forward current or by a different power supply. The reverse current de-plates a fraction of the copper plated on the patterned substrate 400 during the delivery of the forward current. In more embodiments, the reverse current de-plates less than or about 50 wt. % of the copper plated in the previous delivery of the forward current. In still more embodiments, the reverse current de-plates a fraction of the previously-plated copper that is less than or about 45 wt. %, less than or about 40 wt. %, less than or about 35 wt. %, less than or about 30 wt. %, less than or about 25 wt. %, less than or about 20 wt. %, less than or about 15 wt. %, less than or about 10 wt. %, less than or about 5 wt. %, or less. As noted above, the reverse current de-plates more plated copper from the sidewall surfaces 408 than the bottom surface of opening 404. In embodiments, the difference in the amount of copper de-plated from the sidewall surfaces and bottom surface may be greater than or about 5%, greater than or about 10%, greater than or about 15%, greater than or about 20%, greater than or about 25%, greater than or about 30%, greater than or about 35%, greater than or about 40%, greater than or about 45%, greater than or about 50%, or more.

In some embodiments, the reverse current may be a pulsed current that has the same or similar average current density and peak current density as the forward current and a shorter period of on-time during its duty cycle. In additional embodiments, the reverse current may be a pulsed current with a lower average and peak current density than the forward current and the same or similar period of on-time during a comparable duty cycle. In further embodiments, the pulse of reverse current may be characterized by a duty cycle of less than or about 50%, less than or about 45%, less than or about 40%, less than or about 35%, less than or about 30%, less than or about 25%, less than or about 20%, or less. In further embodiments, the on-time of the duty cycle may be less than or about 100 milliseconds, less than or about 90 milliseconds, less than or about 80 milliseconds, less than or about 70 milliseconds, less than or about 60 milliseconds, less than or about 50 milliseconds, less than or about 40 milliseconds, less than or about 30 milliseconds, less than or about 20 milliseconds, less than or about 10 milliseconds, or less. In still further embodiments, the reverse current may be characterized by an average current density of less than or about 2.0 mA/cm$^2$, less than or about 1.5 mA/cm$^2$, less than or about 1.0 mA/cm$^2$, less than or about 0.5 mA/cm$^2$, or lower. In still more embodiments, the reverse current may be characterized by a peak current density of greater than or about 2 mA/cm$^2$, and may be greater than or about 5 mA/cm$^2$, greater than or about 10 mA/cm$^2$, greater than or about 20 mA/cm$^2$, greater than or about 50 mA/cm$^2$, or higher.

In more embodiments, the number of cycles of forward and reverse current being delivered to the patterned substrate 400 in contact with the electrochemical plating fluid in the electroplating chamber depends on the net NTCu plated after each cycle and the total amount of copper-containing material to fill the opening 404. In embodiments, the number of cycles may be greater than or about 1 cycle, greater than or about 2 cycles, greater than or about 3 cycles, greater than or about 4 cycles, greater than or about 5 cycles, greater than or about 6 cycles, greater than or about 7 cycles, greater than or about 8 cycles, greater than or about 9 cycles, greater than or about 10 cycles, greater than or about 15 cycles, greater than or about 20 cycles, or more. In still more embodiments, the overall plating rate of the NTCu-containing material may be characterized by a deposition rate of greater than or about 0.1 μm/minute, greater than or about 0.2 μm/minute, greater than or about 0.3 μm/minute, greater than or about 0.4 μm/minute, greater than or about 0.5 μm/minute, greater than or about 0.6 μm/minute, greater than or about 0.7 μm/minute, greater than or about 0.8 μm/minute, greater than or about 0.9 μm/minute, greater than or about 1 μm/minute, or more.

In embodiments, the electrochemical plating fluid in contact with the patterned substrate 400 during the plating operation may be an aqueous solution that includes copper ions. In further embodiments, the concentration of copper ions may be greater than or about 0.1 M, greater than or about 0.2 M, greater than or about 0.3 M, greater than or about 0.4 M, greater than or about 0.5 M, greater than or about 0.6 M, greater than or about 0.7 M, greater than or about 0.7 M, greater than or about 0.9 M, greater than or about 1 M, or more. In more embodiments, the copper ions may be supplied by water-soluble copper-containing salts such as copper sulfate and copper chloride, among other copper-containing salts. In additional embodiments, the electrochemical plating fluid may have a pH of greater than or about 2, greater than or about 3, greater than or about 4, greater than or about 5, greater than or about 6, greater than or about 7, greater than or about 8, greater than or about 9, greater than or about 10, greater than or about 11, greater than or about 12, or more. In yet additional embodiments, the pH of the electrochemical plating fluid may be adjusted by an acid such as sulfuric acid or hydrochloric acid, among other acids. In still further embodiments, the electrochemical plating fluid may include one or more additional compounds to facilitate the plating of the NTCu-containing material, such as one or more thickening agents, one or more surfactants, one or more accelerators, one or more levelers, one or more suppressors, and one or more polarizers, among other compounds.

Embodiments of method 300 may still further include polishing a contact surface of the plated NTCu-containing material at operation 330. In embodiments, polishing the contact surface may include chemical-mechanical-polishing (CMP) of the surface to reduce the average surface roughness and remove surface contaminants. In additional embodiments, polishing the contact surface may include electropolishing the surface by oxidizing and dissolving jagged portions of the surface in an electropolishing medium. In further embodiments, the polishing operation 330 may include a combination of CMP and electropolishing. In yet further embodiments, the polishing operation 330 may decrease the average surface roughness of a contact surface of the as-plated NTCu-containing material by greater than or about 10%, greater than or about 20%, greater than or about 30%, greater than or about 40%, greater than or about 50%, or more. In still further embodiments, the polishing operation 330 may reduce the average surface roughness of the contact surface to less than or about 10 nm, less than or about 7.5 nm, less than or about 5 nm, less than or about 2.5 nm, less than or about 1 nm, or less.

In embodiments, CMP operations that smooth down the surface roughness to the level described above often leave a concave, dished surface that has a lower height in the center than on the periphery of the polished surface. In direct copper-to-copper binding operations, the concave surface can leave a gap in the middle of the interconnected ends. The gap can result in a smaller contact area between the opposite facing ends of the interconnect and reduced electrical conductivity through the interconnect structure. On the other hand, the large amount of NTCu copper in the polished surface can transform the concave profile at room temperature into a more flat profile at the elevated temperature of the binding operation. The transformation from a concave to flat profile occurs due to the thermal expansion of the NTCu-containing material, which is more constrained at the periphery of the contact surface than the center of the contact surface. In additional embodiments, the increased thermal expansion at the center of the polished NTCu-containing material compared to the periphery at the elevated temperature of the binding operation may reduce the difference in height between the center and periphery of the polished surface to less than or about 100 nm, less than or about 50 nm, less than or about 25 nm, less than or about 10 nm, less than or about 5 nm, less than or about 1 nm, or less.

In embodiments, CMP operations to polish the contact surface of the NTCu-containing material may include contacting the surface with a CMP pad that contains a slurry. In further embodiments, the slurry may include chemical additives and particulate abrasives. In additional embodiments, the chemical additives may include oxidizers (such as hydrogen peroxide, potassium ferricyanide, and ferric chloride, among other oxidizers) that form a removable oxide film on the contact surface. In further embodiments, the chemical additives may include inhibitors and complexing agents (such as benzotriazole and ammonia, among others) that affect the formation and removal rates of the oxide film from the contact surface.

In some embodiments, method 300 may also optionally include forming a second metal layer on the contact surface of the NTCu-containing material at operation 335. The second metal layer may include one or more copper-free metals that can further enhance bond formation in copper-to-copper bonding of NTCu-containing contact surfaces. In embodiments, the second metal layer can increase the diffusivity of the NTCu copper in the contact surface by greater than or about 10%, greater than or about 25%, greater than or about 50%, greater than or about 75%, greater than or about 100%, or more. In more embodiments, the second metal layer may include one or more non-copper metals such as gallium, silver, gold, or platinum, among other metals. In further embodiments, the second metal layer may have a thickness of less than or about 100 nm, less than or about 50 nm, less than or about 25 nm, less than or about 10 nm, or less. In still further embodiments, the second metal layer may be formed on the contact surface by physical vapor deposition, chemical vapor deposition, or atomic layer deposition, among other deposition techniques.

The finished surface contacts of the NTCu-containing material are characterized by enhanced copper-to-copper binding properties, such as binding temperature and binding pressure. In embodiments, the binding temperature of the copper-to-copper contacts may be less than or about 200° C., less than or about 190° C., less than or about 180° C., less than or about 170° C., less than or about 160° C., less than or about 150° C., less than or about 140° C., less than or about 130° C., less than or about 120° C., less than or about 110° C., less than or about 100° C., or less. In further embodiments, the binding pressure when pressing together opposite facing contact surfaces may be characterized as less than or about 10 MPa, less than or about 7.5 MPa, less than or about 5 MPa, less than or about 2.5 MPa, less than or about 1 MPa, or less.

Embodiments of the present technology provide contact surfaces that include nanotwin-phased copper (NTCu) for a variety of integrated circuit structures, including high-density interconnect lines, vias, and pillars, among other kinds of metal-containing IC structures. The embodiments address the problems of forming and stabilizing contact surfaces characterized by a high percentage of the contact surface area being made of NTCu. The embodiments include a number of strategies to that favor the plating of nanotwin-phased copper at the top portion of an opening in a patterned substrate, and slow the transformation of the NTCu into other crystalline phases, such as polycrystalline copper. Embodiments of the present technology also include polishing the contact surface of the NTCu-containing material to reduce surface roughness and remove oxides and other contaminants that reduce binding effectiveness of the contact surface. Embodiments of the present technology further include the forming of a second, non-copper, metal layer on the contact surface to further enhance the binding effectiveness of the surface.

These and other embodiments of the present technology provide NTCu-containing contact surfaces with improved binding effectiveness over conventional copper contact surfaces that consist primarily of polycrystalline copper.

In the preceding description, for the purposes of explanation, numerous details have been set forth in order to provide an understanding of various embodiments of the present technology. It will be apparent to one skilled in the art, however, that certain embodiments may be practiced without some of these details, or with additional details. For example, other substrates that may benefit from the wetting techniques described may also be used with the present technology.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included. Where multiple values are provided in a list, any range encompassing or based on any of those values is similarly specifically disclosed.

As used herein and in the appended claims, the singular forms "a", "an", and "the" include plural references unless the context clearly dictates otherwise. Thus, for example, reference to "a material" includes a plurality of such materials, and reference to "the period of time" includes reference to one or more periods of time and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. An electroplating method comprising:
    plating a metal material into at least one opening on a patterned substrate, wherein at least a portion of the metal material is characterized by a nanotwin crystal structure; and
    polishing an exposed surface of the metal material in the opening to reduce an average surface roughness of the exposed surface to less than or about 1 nm, wherein the polished exposed surface comprises at least a portion of the metal material characterized by the nanotwin crystal structure.

2. The electroplating method of claim 1, wherein the metal material characterized by the nanotwin crystal structure is nanotwin copper.

3. The electroplating method of claim 2, wherein the metal material comprises at least a second metal selected from the group consisting of silver, gold, and platinum.

4. The electroplating method of claim 1, wherein the exposed surface of the metal material is polished with chemical mechanical polishing.

5. The electroplating method of claim 1, wherein the exposed surface of the metal material is further polished with electropolishing.

6. The electroplating method of claim 1, wherein the polishing of the exposed surface of the metal material is performed in an oxygen-free environment, and wherein the polishing removes one or more metal oxides from the exposed surface of the metal material.

7. The electroplating method of claim 1, wherein the metal material comprises a first portion in contact with a bottom surface of the opening that is free of the nanotwin crystal structure and a second portion in contact with the polished exposed surface that comprises the nanotwin crystal structure.

8. The electroplating method of claim 7, wherein the patterned substrate further comprises a barrier layer positioned between the first portion and the second portion of the metal material in the opening.

9. An electroplating method comprising:
    plating a first portion of a metal material on a bottom portion of at least one opening on a patterned substrate, wherein the first portion of the metal material is substantially free of nanotwin crystal structures;
    forming a barrier layer on the first portion of the metal material;
    plating a second portion of the metal material on the barrier layer, wherein the second portion of the metal material is characterized by a nanotwin crystal structure; and
    polishing an exposed surface of the second portion of the metal material in the opening to reduce an average surface roughness of the exposed surface to less than or about 1 nm.

10. The electroplating method of claim 9, wherein the first portion of the metal material is greater than or about 50 wt. % of a total amount of the metal material in the opening.

11. The electroplating method of claim 9, wherein the metal material is copper.

12. The electroplating method of claim 11, wherein the second portion of the metal material comprises at least a second metal selected from the group consisting of silver, gold, and platinum.

13. The electroplating method of claim 9, wherein the barrier layer comprises a metal that is not included in the second portion of the metal material.

14. An integrated circuit device structure comprising:
    a patterned substrate comprising at least one opening, wherein the opening includes a top portion and bottom surface; and
    a metal-containing material filling at least the top portion of the opening, wherein the metal-containing material comprises an exposed surface having an average surface roughness of the exposed surface to less than or about 1 nm, and wherein the metal-containing material is characterized by a nanotwin crystal structure.

15. The integrated circuit device structure of claim 14, wherein the patterned substrate further comprises a barrier layer positioned between the metal-containing material filling the top portion of the opening and a second portion of the metal-containing material in contact with the bottom surface of the opening.

16. The integrated circuit device structure of claim 15, wherein the second portion of the metal-containing material is free of the nanotwin crystal structure.

17. The integrated circuit device structure of claim 14, wherein the metal-containing material comprises copper.

18. The integrated circuit device structure of claim 17, wherein the metal-containing material in the top portion of the opening comprises at least a second metal selected from the group consisting of silver, gold, and platinum.

19. The integrated circuit device structure of claim 14, wherein the opening is characterized by an aspect ratio greater than or about 1:1.

* * * * *